(12) United States Patent
Yamauchi

(10) Patent No.: US 11,587,840 B2
(45) Date of Patent: Feb. 21, 2023

(54) SEMICONDUCTOR DEVICE AND MANUFACTURING METHOD THEREOF

(71) Applicants: Kabushiki Kaisha Toshiba, Tokyo (JP); Toshiba Electronic Devices & Storage Corporation, Tokyo (JP)

(72) Inventor: Hideyuki Yamauchi, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 51 days.

(21) Appl. No.: 17/012,563

(22) Filed: Sep. 4, 2020

(65) Prior Publication Data

US 2021/0296193 A1 Sep. 23, 2021

(30) Foreign Application Priority Data

Mar. 19, 2020 (JP) .............................. JP2020-050007

(51) Int. Cl.

| | |
|---|---|
| *H01L 21/3065* | (2006.01) |
| *H01L 21/56* | (2006.01) |
| *H01L 21/78* | (2006.01) |
| *H01L 21/308* | (2006.01) |
| *H01L 23/31* | (2006.01) |

(52) U.S. Cl.
CPC ........ *H01L 23/3114* (2013.01); *H01L 21/308* (2013.01); *H01L 21/3065* (2013.01); *H01L 21/565* (2013.01); *H01L 21/78* (2013.01)

(58) Field of Classification Search
None
See application file for complete search history.

(56) References Cited

U.S. PATENT DOCUMENTS

| | | | |
|---|---|---|---|
| 7,675,153 B2 | 3/2010 | Kurosawa et al. | |
| 9,780,021 B2 | 10/2017 | Harikai et al. | |
| 2003/0062613 A1 | 4/2003 | Masumoto et al. | |
| 2011/0175209 A1* | 7/2011 | Seddon | ............ H01L 21/76898 |
| | | | 257/659 |
| 2018/0096944 A1* | 4/2018 | Mori | ...................... H01L 24/97 |
| 2018/0240678 A1 | 8/2018 | Itou et al. | |
| 2020/0098635 A1* | 3/2020 | Jeon | ........................ H01L 21/56 |

FOREIGN PATENT DOCUMENTS

| | | |
|---|---|---|
| JP | 2003-163313 A | 6/2003 |
| JP | 2006-216691 A | 8/2006 |
| JP | 2013-207279 A | 10/2013 |
| JP | 2017-139370 A | 8/2017 |
| JP | 2018-137405 A | 8/2018 |

* cited by examiner

*Primary Examiner* — Jay C Chang
(74) *Attorney, Agent, or Firm* — Allen & Overy LLP

(57) ABSTRACT

Provided is a semiconductor device including: a substrate; an electrode layer provided on the substrate; a semiconductor chip being provided on the electrode layer, including a first side surface portion having a first angle with respect to a substrate surface of the substrate, and including a second side surface portion being provided below the first side surface portion and having a second angle smaller than the first angle with respect to the substrate surface; and a resin being provided around the electrode layer and the semiconductor chip and being in contact with the first side surface portion and the second side surface portion.

3 Claims, 6 Drawing Sheets

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2020-050007, filed on Mar. 19, 2020, the entire contents of which are incorporated herein by reference.

FIELD

Embodiments described herein relate generally to semiconductor devices.

BACKGROUND

Semiconductor devices having a semiconductor chip such as a metal oxide semiconductor field effect transistor (MOSFET) are used for applications of power conversion and the like. Such a semiconductor chip is used after being sealed with a resin. It is preferable that the sealed state by the resin is good.

DETAILED DESCRIPTION

Figure 1:
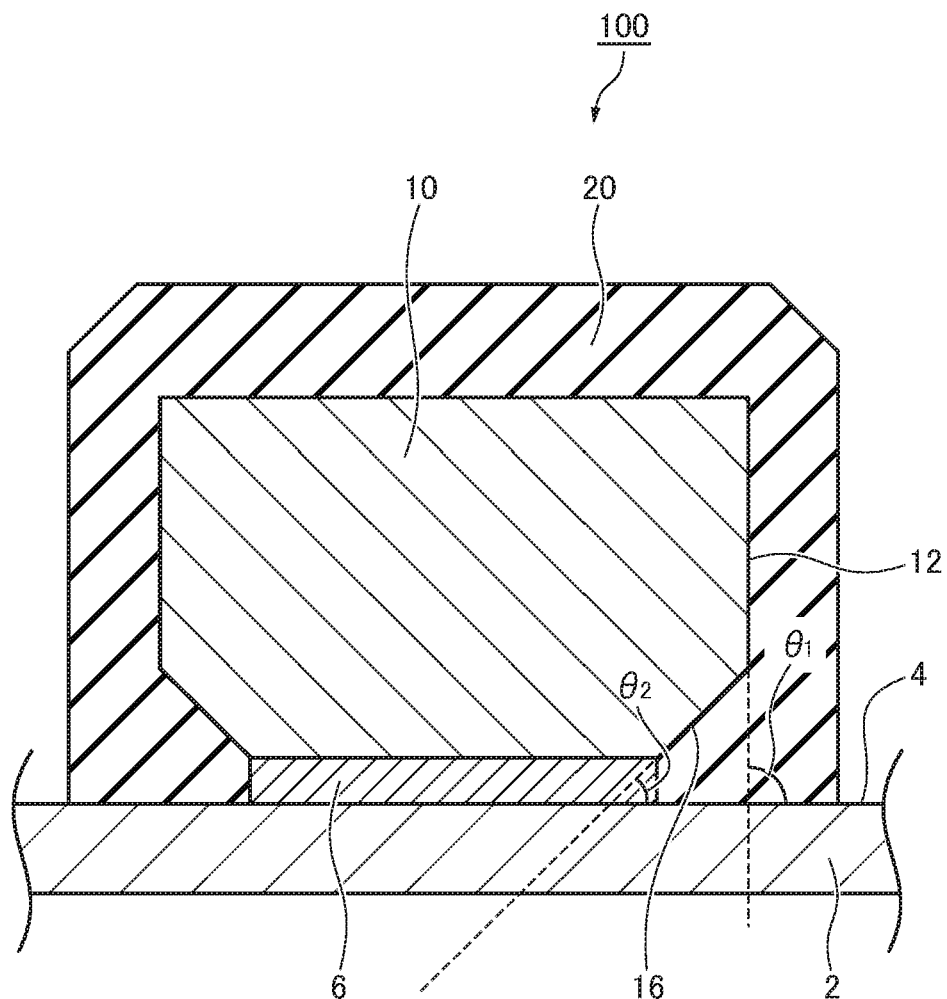
FIG. 1 is a schematic cross-sectional diagram of a semiconductor device according to an embodiment.

A semiconductor device according to the embodiment includes: a substrate; an electrode layer provided on the substrate; a semiconductor chip being provided on the electrode layer, including a first side surface portion having a first angle with respect to a substrate surface of the substrate, and including a second side surface portion being provided below the first side surface portion and having a second angle smaller than the first angle with respect to the substrate surface; and a resin being provided around the electrode layer and the semiconductor chip and being in contact with the first side surface portion and the second side surface portion.

Hereinafter, an embodiment will be described with reference to the drawings. In addition, in the following description, the same members and the like will be denoted by the same reference numerals, and the description of the members and the like once described will be appropriately omitted.

In this specification, in order to illustrate the positional relationship of parts and the like, the upward direction of the drawings is referred to as "upper", and the downward direction of the drawings is referred to as "lower". In this specification, the terms "upper" and "lower" do not necessarily indicate the relationship with the direction of gravity.

Embodiment

A semiconductor device according to the embodiment includes: a substrate; an electrode layer provided on the substrate; a semiconductor chip being provided on the electrode layer, including a first side surface portion having a first angle with respect to a substrate surface of the substrate, and including a second side surface portion being provided below the first side surface portion and having a second angle smaller than the first angle with respect to the substrate surface; and a resin being provided around the electrode layer and the semiconductor chip and being in contact with the first side surface portion and the second side surface portion.

FIG. 1 is a schematic cross-sectional diagram of a semiconductor device 100 according to the embodiment. The semiconductor device 100 according to the embodiment is, for example, a MOSFET.

The semiconductor device 100 includes a substrate 2, an electrode layer 6, a semiconductor chip 10, and a resin 20.

The substrate 2 has a substrate surface 4. The substrate 2 contains, for example, a metal material or a semiconductor material. Herein, the metal material is, for example, copper (Cu), aluminum (Al), nickel (Ni), silver (Ag), gold (Au), or the like. In addition, the semiconductor material is, for example, silicon (Si), silicon carbide (SiC), gallium arsenide (GaAs), gallium nitride (GaN), or the like. However, the substrate 2 may be a resin substrate containing, for example, a resin material.

The electrode layer 6 is provided on the substrate surface 4 of the substrate 2. The electrode layer 6 is bonded to, for example, the substrate surface 4. The electrode layer 6 functions, for example, as a drain electrode of a MOSFET. The electrode layer 6 contains a metal material. Herein, the metal material is, for example, copper (Cu), aluminum (Al), nickel (Ni), silver (Ag), gold (Au), or the like, but is not limited to copper (Cu), aluminum (Al), nickel (Ni), silver (Ag), gold (Au), or the like. In addition, the electrode layer 6 may be a portion of the semiconductor chip 10.

The semiconductor chip 10 is provided on the electrode layer 6. For example, the electrode layer 6 is a back surface electrode of the semiconductor chip 10. For example, the bottom surface of the semiconductor chip 10 is electrically connected to the electrode layer 6. The semiconductor chip 10 has a first side surface portion 12 and a second side surface portion 16 on the side surface. The first side surface portion 12 has a first angle $\theta_1$ with respect to the substrate surface 4. The first angle $\theta_1$ is, for example, 90 degrees. Although the first angle $\theta_1$ is illustrated as 90 degrees in FIG. 1, the first angle $\theta_1$ is not limited to 90 degrees. The second side surface portion 16 is provided below the first side surface portion 12. The second side surface portion 16 has a second angle $\theta_2$ smaller than the first angle $\theta_1$ with respect to the substrate surface 4. In addition, in FIG. 1, both the first angle $\theta_1$ and the second angle $\theta_2$ are set as angles taken counterclockwise from the substrate surface 4. The same applies to FIG. 2 described later.

The resin 20 is provided around the electrode layer 6 and the semiconductor chip 10. The resin 20 is in contact with the substrate surface 4, the electrode layer 6, the upper surface, the first side surface portion 12, and the second side surface portion 16 of the semiconductor chip 10 and seals the electrode layer 6 and the semiconductor chip 10. The resin 20 is, for example, a sealing resin such as an epoxy resin. In addition, the resin 20 may further contain a filler such as silica ($SiO_2$). However, the type of the resin 20 is not limited to the sealing resin and the filler.

Figure 2:
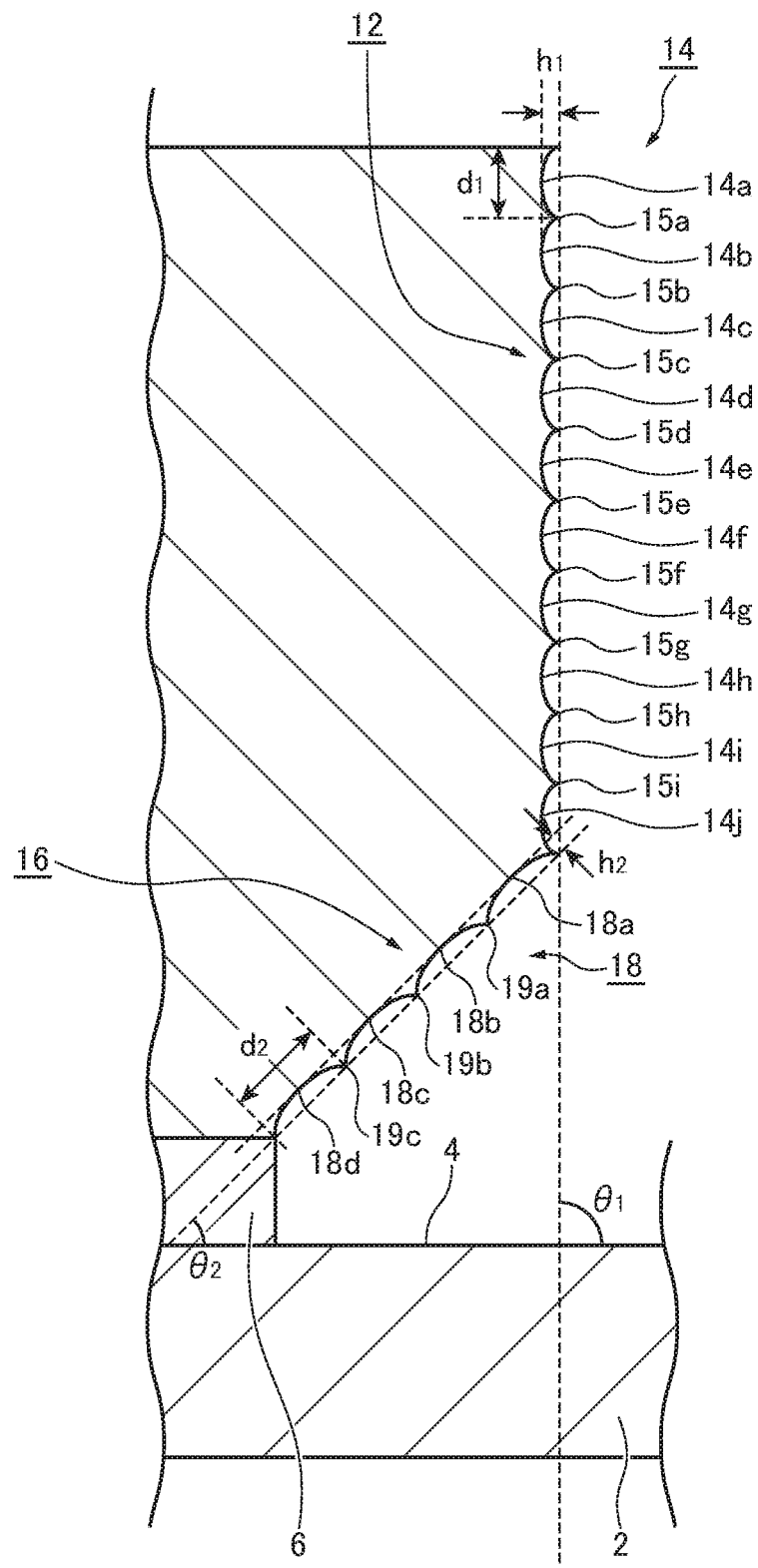
FIG. 2 is a schematic cross-sectional diagram of main portions of the semiconductor device according to the embodiment.

FIG. 2 is a schematic cross-sectional diagram of main portions of the semiconductor device 100 according to the embodiment. In addition, in FIG. 2, illustration of the resin 20 is omitted.

The first side surface portion 12 has a plurality of first scallops 14 formed at a first pitch $d_1$. In FIG. 2, first scallops 14a, 14b, 14c, 14d, 14e, 14f, 14g, 14h, 14i, and 14j are illustrated as the first scallops 14. The second side surface portion 16 has a plurality of second scallops 18 formed at a second pitch $d_2$. In FIG. 2, second scallops 18a, 18b, 18c and 18d are illustrated as the second scallops 18. The first pitch $d_1$ and the second pitch $d_2$ are preferably 10 μm or less. Then, the resin 20 is in contact with the first scallops 14 and the second scallops 18. The second pitch $d_2$ is preferably larger than the first pitch $d_1$, that is, $d_2 > d_1$.

The first scallops 14 and the second scallops 18 are formed, for example, when the substrate 2 containing Si is cut by plasma etching. As described later, such plasma etching is performed by repeating, for example, isotropic etching using fluorine (F)-based radicals, forming of a protective film containing carbon tetrafluoride ($CF_4$)-based radicals, and anisotropic etching using F-based ions. By such plasma etching, a scallop having a shell-like shape is formed. Specifically, the first scallops 14 are formed on the first side surface portion 12, and the second scallops 18 are formed on the second side surface portion 16.

In addition, the first angle $\theta_1$ is set to the angle formed by the line segment connecting a plurality of vertices 15 provided between the respective first scallops 14 and the substrate surface 4. In FIG. 2, vertices 15a, 15b, 15c, 15d, 15e, 15f, 15g, 15h, and 15i are illustrated as the vertices 15. In addition, the second angle $\theta_2$ is set to the angle formed by the line segment connecting a plurality of vertices 19 provided between the respective second scallops 18 and the substrate surface 4. In FIG. 2, vertices 19a, 19b, and 19c are illustrated as the vertices 19.

Figure 3A:
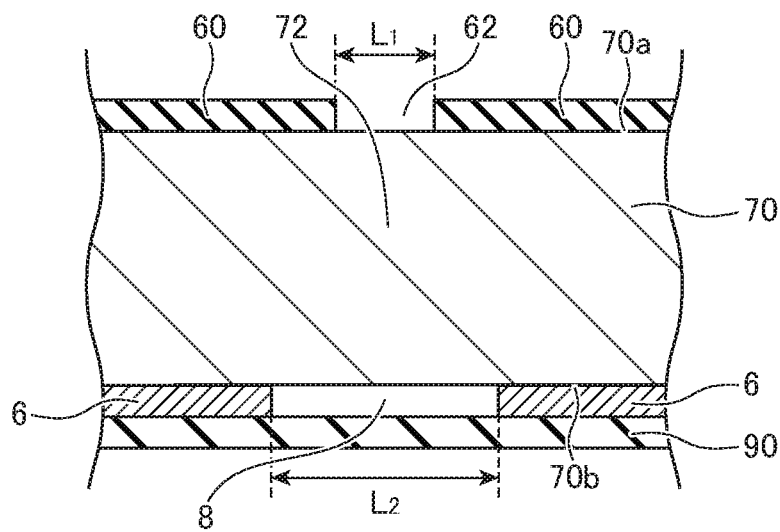
FIGS. 3A to 3C are schematic cross-sectional diagrams illustrating processes of manufacturing the semiconductor device according to the embodiment.
Figure 3B:
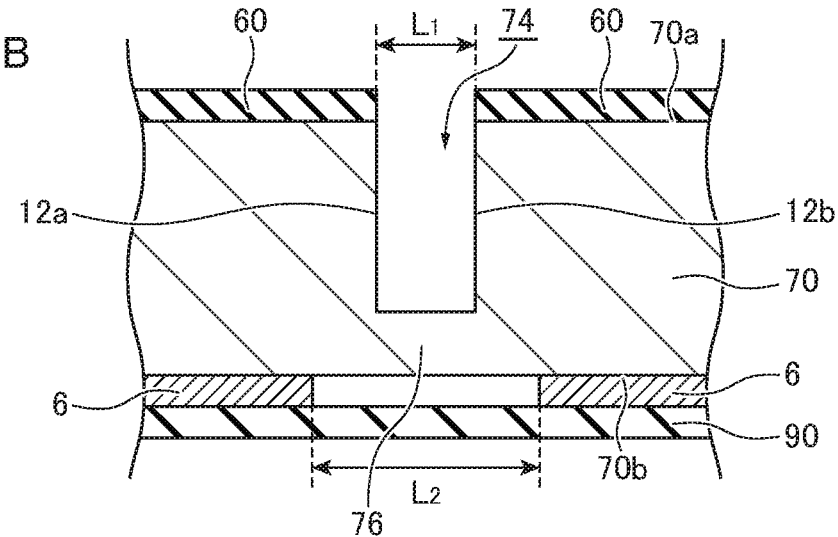
Figure 3C:
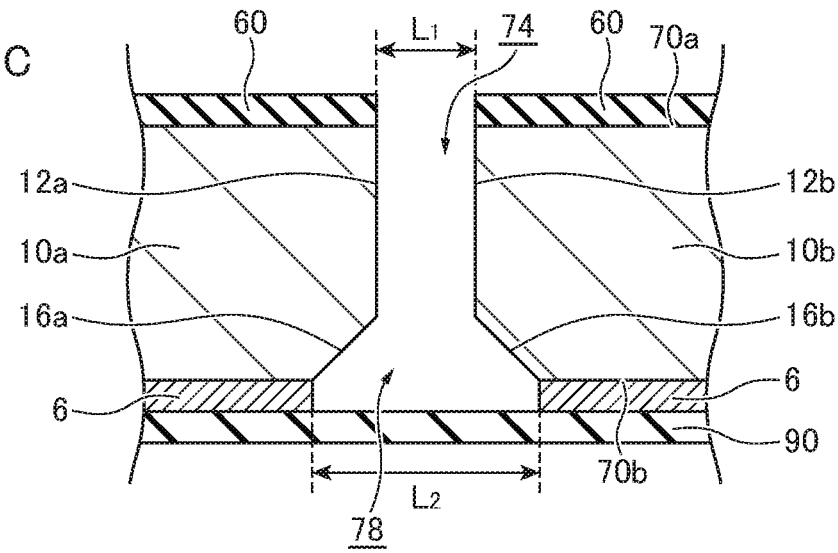

FIGS. 3A to 3C are schematic cross-sectional diagrams illustrating the processes of manufacturing the semiconductor device 100 according to the embodiment.

A method of manufacturing a semiconductor device according to the embodiment includes: first gap 74 having a first side surface portion 12 is formed by performing first etching of a first portion 72 of the semiconductor substrate, using a mask having a first opening 62 having a first width $L_1$, the first portion 72 being provided below the first opening 62, the mask being provided on the semiconductor substrate having an electrode layer 6 opposite to the mask; a second gap 78 having an inverse tapered shape and having a second side surface portion 16 is formed by performing second etching of a second portion 76 of the semiconductor substrate, the second portion 76 being provided below the first gap 74; a semiconductor chip 10 is formed by dividing the semiconductor substrate by forming the second gap 78; the semiconductor chip 10 are disposed via the electrode layer 6 on a substrate 2; and a resin 20 is formed around the semiconductor chip 10 on the substrate 2.

The semiconductor substrate 70 is a substrate on which the semiconductor chip 10 is formed. A mask 60 which is, for example, a photomask is provided on an upper surface 70a of the semiconductor substrate. The mask 60 has the first opening 62 having a first width $L_1$. The electrode layer 6 is provided below a lower surface 70b of the semiconductor substrate. The electrode layer 6 has a second opening 8 having a second width $L_2$ larger than the first width $L_1$. The second opening 8 is provided below the first opening 62. The first opening 62 and the second opening 8 are scribe lines for dicing. The MOSFET included in the semiconductor chip 10 is formed, for example, on the upper surface 70a of the semiconductor substrate. The electrode layer 6 is fixed on a known dicing tape 90 (FIG. 3A).

Herein, etching (an example of the first etching) of the first portion 72 of the semiconductor substrate 70 provided below the first opening 62 is performed. Accordingly, the first gap 74 is formed below the first opening 62 (FIG. 3B). The first gap 74 is formed in a stripe shape, for example, parallel to the upper surface 70a or the lower surface 70b of the semiconductor substrate. The side surfaces of the first gap 74 of the semiconductor substrate 70 serve as the first side surface portions 12 that are a first side surface portion 12a and a first side surface portion 12b.

Next, etching (an example of the second etching) of the second portion 76 of the semiconductor substrate 70 provided below the first gap 74 is performed. Accordingly, the second gap 78 having an inverse tapered shape is formed. The second gap 78 connects the second opening 8 and the first gap 74. In addition, the second gap 78 is formed in a stripe shape, for example, parallel to the upper surface 70a or the lower surface 70b of the semiconductor substrate. Accordingly, the semiconductor substrate 70 is divided, and thus, semiconductor chips 10a and 10b are formed. The side surfaces of the second gap 78 of the semiconductor substrate 70 serve as the second side surface portions 16 that are a second side surface portion 16a and a second side surface portion 16b (FIG. 3C).

Next, the dicing tape 90 is peeled off from the electrode layer 6. Next, the electrode layer 6 and the semiconductor chip 10 are disposed on the substrate 2 (not illustrated in FIGS. 3A to 3C). Next, the resin 20 (not illustrated in FIGS. 3A to 3C) is formed around the electrode layer 6 and the semiconductor chip on the substrate 2. Accordingly, the semiconductor device 100 according to the embodiment is obtained.

Figure 4A:
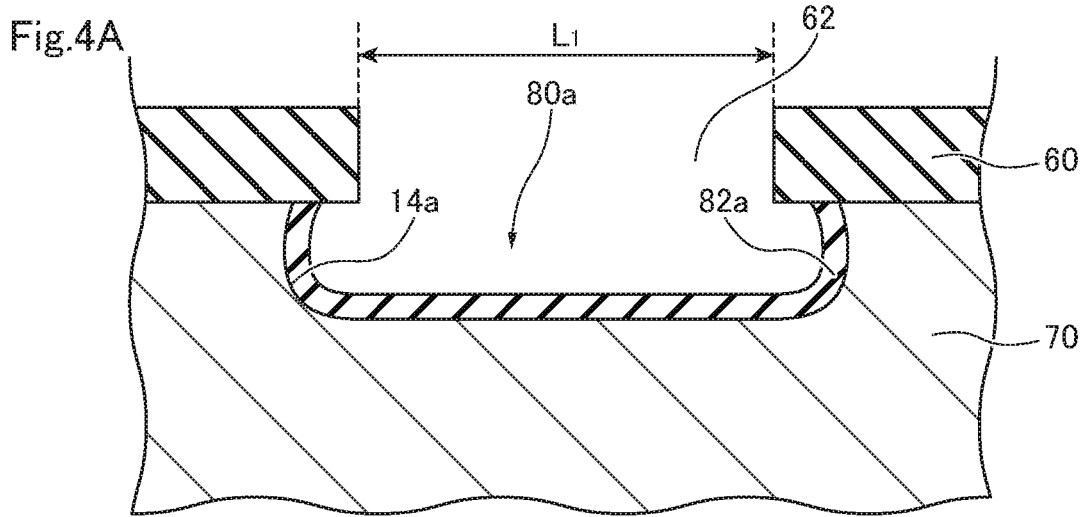
FIGS. 4A to 4C are schematic cross-sectional diagrams illustrating processes of manufacturing the main portions of the semiconductor device according to the embodiment.
Figure 4B:
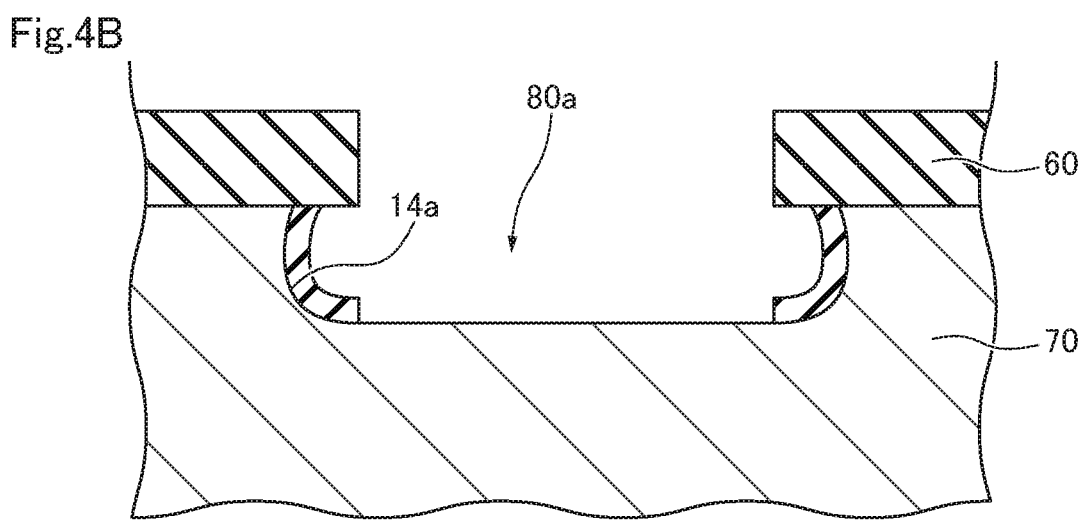
Figure 4C:
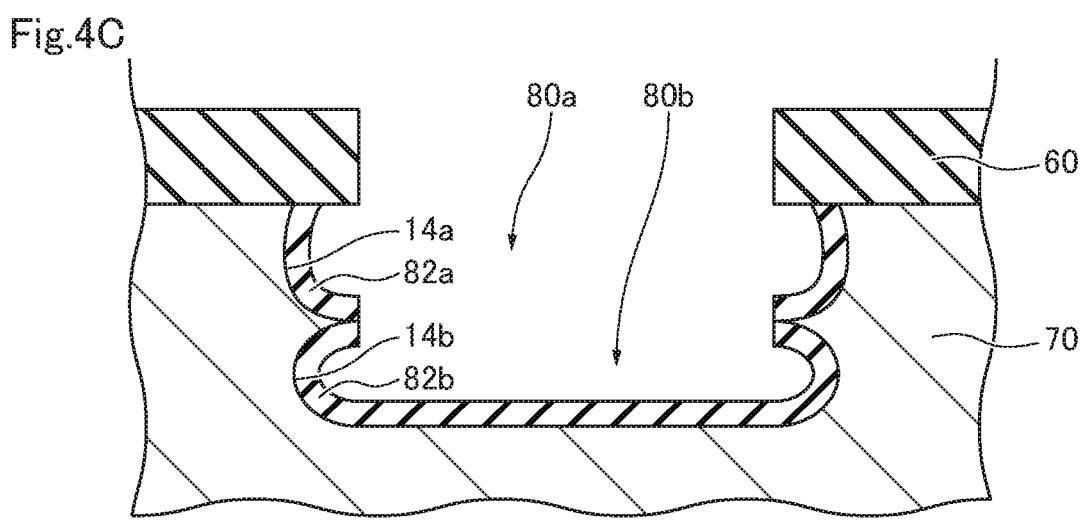

FIGS. 4A to 4C are schematic cross-sectional diagrams illustrating the processes of manufacturing the main portions of the semiconductor device 100 according to the embodiment. FIGS. 4A to 4C are schematic cross-sectional diagrams illustrating the processes of manufacturing the first gap 74.

The mask 60 having the first opening 62 having a first width $L_1$ is provided on the semiconductor substrate 70. A gap 80a is formed below the first opening 62. A first scallop 14a is formed on the side surface of the gap 80a. Herein, a protective film 82a is formed on the side surface and the bottom surface of the gap 80a by using carbon tetrafluoride ($CF_4$)-based radicals (FIG. 4A).

Next, a portion of the protective film 82a formed on the bottom surface of the gap 80a is removed by anisotropic etching, for example, by using F-based ions configured with sulfur hexafluoride ($SF_6$) (FIG. 4B). In addition, the anisotropic etching described with reference to FIG. 4B is an example of the third etching.

Next, a gap 80b is formed below the bottom surface of the gap 80a by isotropic etching using a fluorine (F)-based radical configured with, for example, $SF_6$. The first scallop 14b is formed on the side surface of the gap 80b. Next, a protective film 82b is formed on the side surface and the bottom surface of the gap 80b by using carbon tetrafluoride (CF$_4$)-based radicals (FIG. 4C). In addition, the isotropic etching described with reference to FIG. 4C is an example of the fourth etching.

The first gap 74 is formed by repeating the above-described processes. That is, the first etching is a repetition of the third etching and the fourth etching.

Figure 5A:
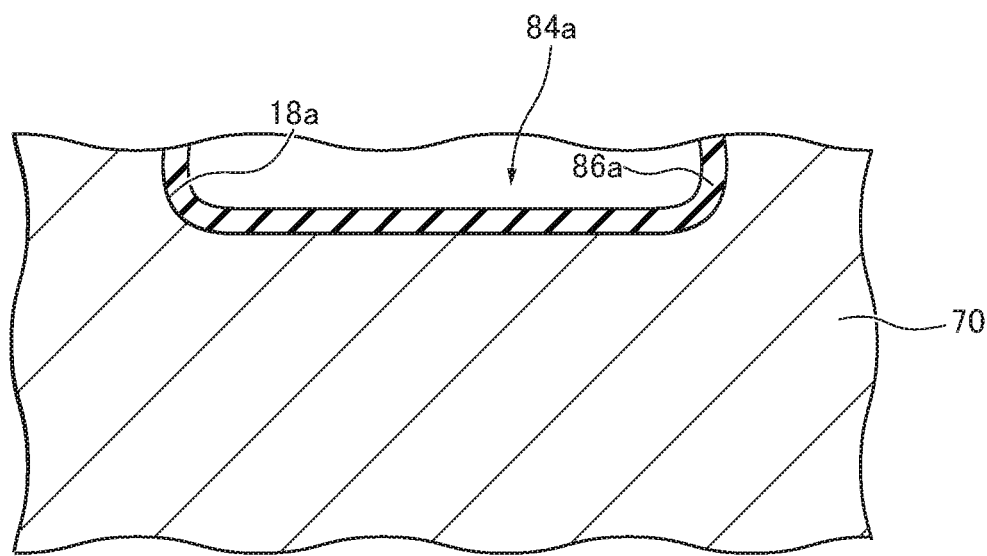
FIGS. 5A to 5C are schematic cross-sectional diagrams illustrating the processes of manufacturing the main portions of the semiconductor device according to the embodiment.
Figure 5B:
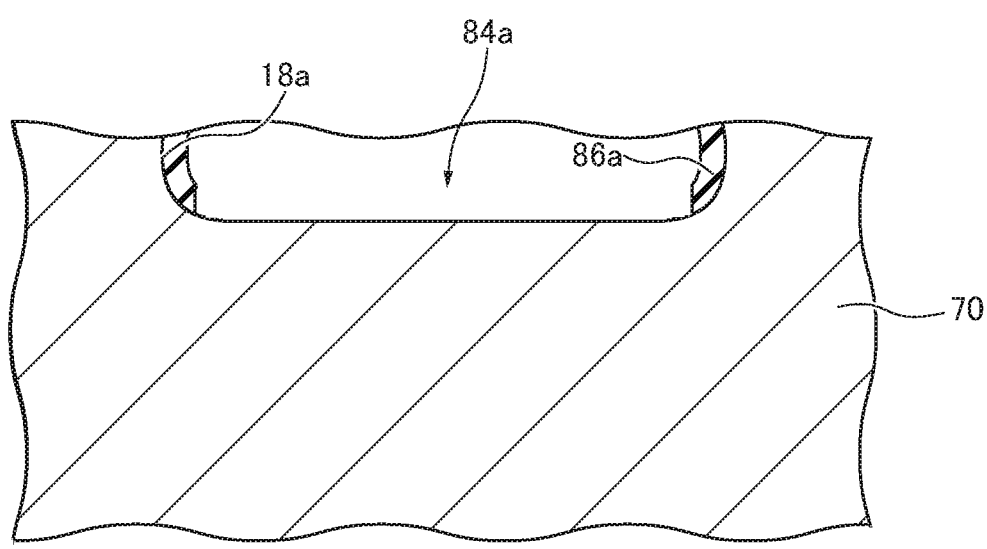
Figure 5C:
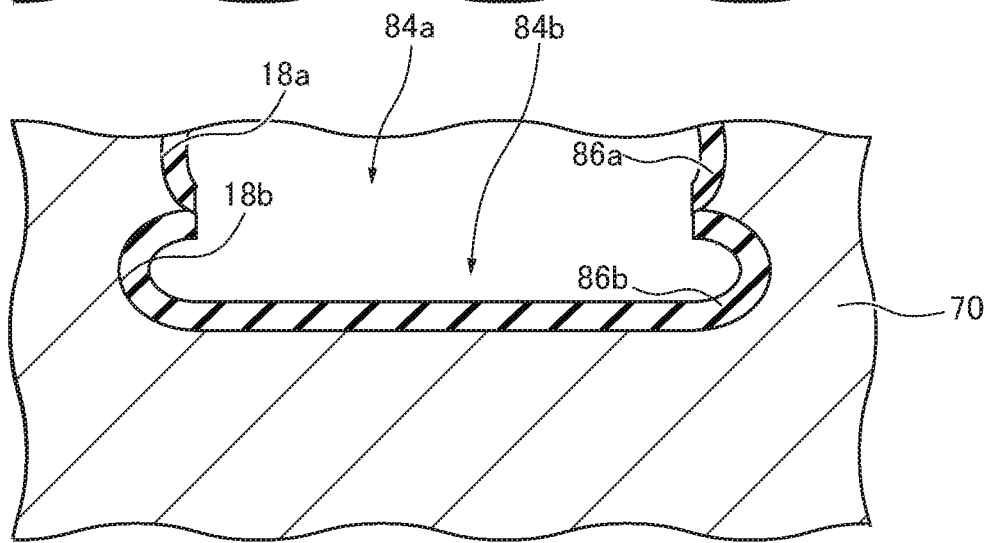

FIGS. 5A to 5C are schematic cross-sectional diagrams illustrating the processes of manufacturing the main portions of the semiconductor device 100 according to the embodiment. FIGS. 5A to 5C are schematic cross-sectional diagrams illustrating the processes of manufacturing the second gap 78.

A second scallop 18a is formed on the side surface of a gap 84a. Herein, a protective film 86a is formed on the side surface and the bottom surface of the gap 84a by using carbon tetrafluoride (CF$_4$)-based radicals (FIG. 5A).

Next, a portion of the protective film 86a formed on the bottom surface of the gap 84a is removed by anisotropic etching, for example, by using F-based ions configured with sulfur hexafluoride (SF$_6$) (FIG. 5B). In addition, the anisotropic etching described with reference to FIG. 5B is an example of the fifth etching.

Next, a gap 84b is formed below the bottom surface of the gap 84a by isotropic etching using a fluorine (F)-based radical configured with, for example, SF$_6$. The second scallop 18b is formed on the side surface of the gap 84b. Herein, for example, the time of the isotropic etching for forming the gap 84b is set to be longer than the time of the isotropic etching for forming the gap 80b. Accordingly, the second pitch d$_2$ becomes larger than the first pitch d$_1$ as described with reference to FIG. 2 (FIG. 2). In addition, the shape of the second gap 78 is an inverse tapered shape. Next, a protective film 86b is formed on the side surface and the bottom surface of the gap 84b by using carbon tetrafluoride (CF$_4$)-based radicals (FIG. 5C). In addition, the isotropic etching described with reference to FIG. 5C is an example of the sixth etching.

The second gap 78 is formed by repeating the above-described processes. That is, the second etching is a repetition of the fifth etching and the sixth etching. Furthermore, the time of the sixth etching is increased for each repetition. Accordingly, the above-described inverse tapered shape is formed. In addition, the time of the sixth etching may be increased, for example, by adding a predetermined time for each repetition. In addition, the time of the sixth etching may be increased in other mode for each repetition, and is not particularly limited.

Next, the functions and effects of the embodiment will be described.

Figure 6A:
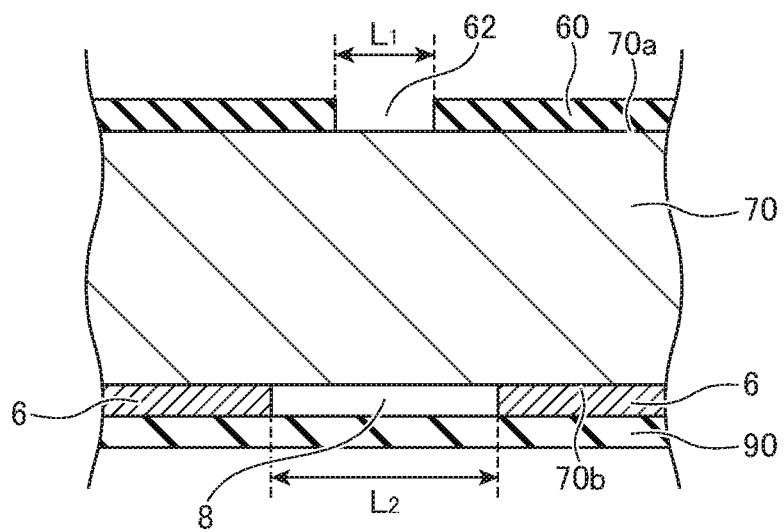
FIGS. 6A to 6C are schematic cross-sectional diagrams illustrating processes of manufacturing a semiconductor device according to Comparative Embodiment.
Figure 6B:
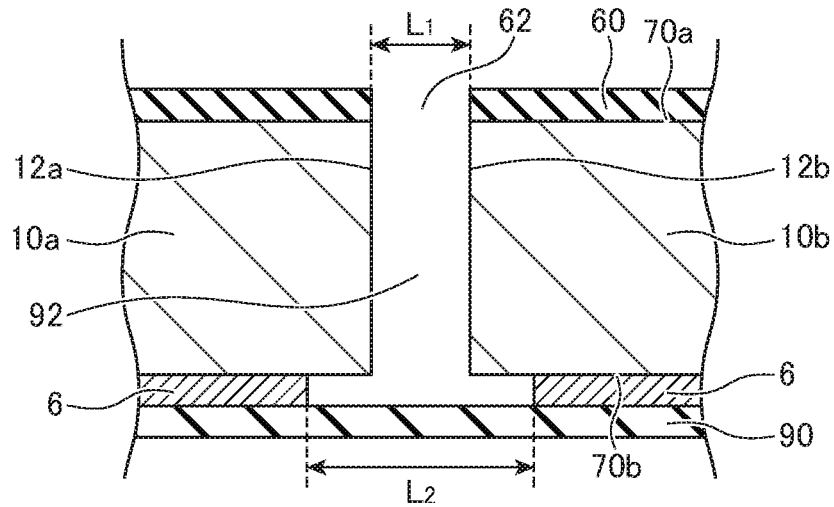
Figure 6C:
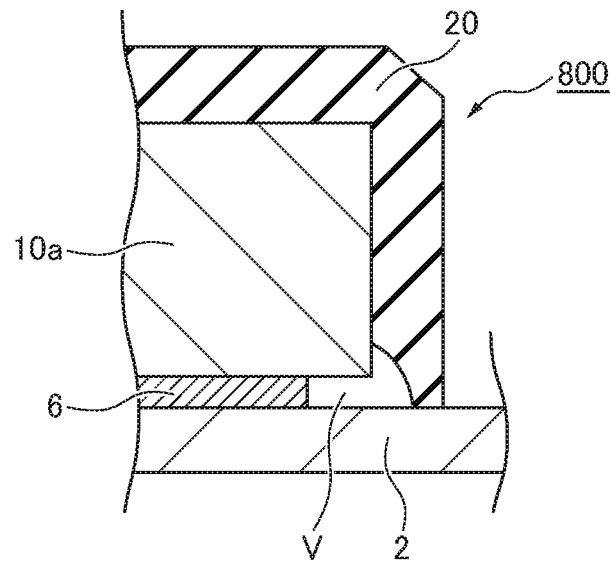

FIGS. 6A to 6C are schematic cross-sectional diagrams illustrating processes of manufacturing a semiconductor device 800 according to Comparative Embodiment.

It is considered that, in the dicing of the semiconductor substrate 70 having the electrode layer 6 below the semiconductor substrate, a portion of the electrode layer 6 is removed to form the second opening 8, and after that, the mask 60 having the first opening 62 is formed on the semiconductor substrate 70. Herein, since the first opening 62 and the second opening 8 are used as scribe lines, the first opening 62 is formed so as to be disposed above the second opening 8.

In a case where the dicing is performed after the mask 60 is formed, it is preferable that the second width L$_2$ of the second opening 8 is larger than the first width L$_1$ of the first opening 62. This is because it is difficult to observe the position of the second opening 8 from above the semiconductor substrate 70. Therefore, this is intended to surely form the first opening 62 above the second opening 8 by increasing the second width L$_2$ in advance. In other words, this is intended to consider the alignment margin (position deviation margin) of the electrode layer 6 with respect to the second opening 8 (FIG. 6A).

However, as illustrated in FIG. 6B, in a case where the dicing is performed by forming a gap 92 perpendicular to the substrate surface of the semiconductor substrate 70, a portion where the electrode layer 6 is not formed is formed on the lower surfaces (bottom surfaces) of the semiconductor chips 10a and 10b. For this reason, in the case of sealing with the resin 20, the resin 20 cannot be inserted into the periphery of the portion where the electrode layer 6 is not formed, and voids V are formed. For this reason, there is a problem in that cracks or the like occur in the resin 20 and the reliability of the semiconductor device 100 is degraded.

Therefore, the semiconductor device 100 according to the embodiment includes the semiconductor chip 10 having the first side surface portion 12 that is provided on the electrode layer 6 and has a first angle $\theta_1$ with respect to the substrate surface 4 of the substrate 2 and the second side surface portion 16 that is provided below the first side surface portion 12 and has a second angle $\theta_2$ smaller than the first angle $\theta_1$ with respect to the substrate surface 4. By having such a second side surface portion 16, the resin 20 is satisfactorily inserted into the second side surface portion 16, so that the formation of the voids V is suppressed. For this reason, it possible to provide a highly reliable semiconductor device.

In addition, in the case of performing plasma etching as in the embodiment, a plurality of first scallops 14 are formed on the first side surface portion 12, and a plurality of second scallops 18 are formed on the second side surface portion 16. Since the first pitch d$_1$ of the first scallops 14 and the second pitch d$_2$ of the second scallops 18 are as small as 10 µm or less, in a case where the resin 20 is inserted into the first scallop 14 and the second scallop 18, the contactability of the resin with the first side surface portion 12 or the second side surface portion 16 is improved, and higher reliability is obtained. On the other hand, even if the resin 20 is not inserted, since the size of the voids formed is extremely small, the reliability is not affected. In addition, there is a problem in that, in a case where a first pitch P$_1$ of the first scallops 14 and a second pitch P$_2$ of the second scallops 18 are larger than 10 µm, voids are formed and the reliability is degraded.

In a manufacturing method according to the embodiment, a first gap 74 having a first side surface portion 12 is formed by performing first etching of a first portion 72 of the semiconductor substrate, using a mask having a first opening 62 having a first width L$_1$, the first portion 72 being provided below the first opening 62, the mask being provided on the semiconductor substrate having an electrode layer 6 opposite to the mask; a second gap 78 having an inverse tapered shape and having a second side surface portion 16 is formed by performing second etching of a second portion 76 of the semiconductor substrate, the second portion 76 being provided below the first gap 74; a semiconductor chip 10 is formed by dividing the semiconductor substrate by forming the second gap 78; the semiconductor chip 10 are disposed via the electrode layer 6 on a substrate 2; and a resin 20 is formed around the semiconductor chip 10 on the substrate 2. Then, a plurality of first scallops 14 formed at a first pitch are formed on the first side surface portion 12 in a direction parallel to the first side surface portion 12 by performing the first etching, and a plurality of second scallops 18 formed at a second pitch are formed on the second side surface portion 16 in a direction parallel to the second side surface portion 16 by performing second etching. Accordingly, the formation of the voids V on the side surface of the semiconductor chip 10 and the lower surface (bottom surface) of the semiconductor chip 10 on which the electrode layer 6 is not formed is suppressed, and a highly reliable semiconductor device is formed.

In addition, the first etching is a repetition of the third etching which is anisotropic etching and the fourth etching which is isotropic etching performed after the third etching. Furthermore, the second etching is a repetition of the fifth etching which is anisotropic etching and the sixth etching which is isotropic etching performed after the fifth etching. Then, the time of the sixth etching is longer than the time of the fourth etching. Furthermore, the time of the sixth etching is increased for each repetition. Accordingly, the second gap having the inverse tapered shape is formed, and the formation of the voids V is suppressed. In addition, when the time of the sixth etching is allowed to be longer than the time of the fourth etching, the second pitch $d_2$ becomes larger than the first pitch $d_1$ ($d_2 > d_1$).

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first gap having a first side surface portion by performing first etching of a first portion of a semiconductor substrate, using a mask having a first opening having a first width, the first portion being provided below the first opening, the mask being provided on the semiconductor substrate having an electrode layer opposite to the mask, and a plurality of first scallops being formed at a first pitch on the first side surface portion in a direction parallel to the first side surface portion by performing the first etching;
    forming a second gap having an inverse tapered shape and having a second side surface portion by performing second etching of a second portion of the semiconductor substrate, the second portion being provided below the first gap, a plurality of second scallops being formed at a second pitch on the second side surface portion in a direction parallel to the second side surface portion by performing the second etching, and the second pitch being larger than the first pitch;
    forming a semiconductor chip by dividing the semiconductor substrate by forming the second gap;
    disposing the semiconductor chip via the electrode layer on a substrate; and
    forming a resin around the semiconductor chip on the substrate,
    wherein the first etching is a repetition of third etching being anisotropic etching and fourth etching being isotropic etching performed after the third etching,
    wherein the second etching is a repetition of fifth etching being anisotropic etching and sixth etching being isotropic etching performed after the fifth etching,
    wherein a time of the sixth etching is longer than a time of the fourth etching,
    wherein the time of the sixth etching is increased by adding a predetermined time for each repetition,
    wherein the first side surface portion has a first angle with respect to a substrate surface of the semiconductor substrate,
    wherein the second side surface portion has a second angle with respect to the substrate surface of the semiconductor substrate, and
    wherein the second angle is smaller than the first angle.

2. The method of manufacturing a semiconductor device according to claim 1,
    wherein the first pitch of the first scallops is 10 μm or less, and
    wherein the second pitch of the second scallops is 10 μm or less.

3. The method of manufacturing a semiconductor device according to claim 1,
    wherein the first angle is 90 degrees.

* * * * *